United States Patent
Wang et al.

(10) Patent No.: US 10,431,733 B2
(45) Date of Patent: Oct. 1, 2019

(54) PERPENDICULAR MAGNETIC TUNNEL JUNCTION DEVICES WITH HIGH THERMAL STABILITY

(71) Applicant: THE ARIZONA BOARD OF REGENTS ON BEHALF OF THE UNIVERSITY OF ARIZONA, Tucson, AZ (US)

(72) Inventors: Weigang Wang, Tucson, AZ (US); Hamid Almasi, Tucson, AZ (US)

(73) Assignee: THE ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 15/633,653

(22) Filed: Jun. 26, 2017

(65) Prior Publication Data

US 2017/0373246 A1    Dec. 28, 2017

Related U.S. Application Data

(60) Provisional application No. 62/355,124, filed on Jun. 27, 2016.

(51) Int. Cl.
| | | |
|---|---|---|
| H01L 43/02 | (2006.01) | |
| H01L 43/08 | (2006.01) | |
| H01L 43/10 | (2006.01) | |
| H01L 43/12 | (2006.01) | |
| H01F 10/30 | (2006.01) | |
| H01F 10/32 | (2006.01) | |
| H01F 41/30 | (2006.01) | |

(52) U.S. Cl.
CPC .............. *H01L 43/02* (2013.01); *H01F 10/30* (2013.01); *H01F 10/3286* (2013.01); *H01F 41/307* (2013.01); *H01L 43/08* (2013.01); *H01L 43/10* (2013.01); *H01L 43/12* (2013.01); *H01F 10/3254* (2013.01); *H01F 10/3272* (2013.01)

(58) Field of Classification Search
None
See application file for complete search history.

(56) References Cited

U.S. PATENT DOCUMENTS

2014/0306303 A1* 10/2014 Moriyama .......... H01F 10/3286
257/421
2016/0233333 A1* 8/2016 Toh .................. H01L 43/12

OTHER PUBLICATIONS

Liu, T. et al. "Thermally robust Mo/CoFeB/MgO trilayers with strong perpendicular magnetic anisotropy," Scientific Reports, Published Jul. 31, 2014, 6 pages.

Oh, Young-Wan et al., "Interfacial perpendicular magnetic anisotrophy in CoFeB/MgO structure with various underlayers," Journal of Applied Physics, vol. 115, No. 17C724, 2014, 4 pages.

(Continued)

*Primary Examiner* — Ali Naraghi
(74) *Attorney, Agent, or Firm* — Talem IP Law, LLP

(57) ABSTRACT

A perpendicular magnetic tunnel junction device (pMTJ) is provided that has a structure of a first heavy metal layer, a first thin dusting layer on the first heavy metal layer, a first CoFeB layer on the thin dusting layer, a MgO barrier layer on the first CoFeB layer, a second CoFeB layer on the MgO barrier layer, a second thin dusting layer on the CoFeB layer; and a second heavy metal layer on the thin dusting layer. The insertion of the thin dusting layer improves thermal stability of the pMTJ structure.

15 Claims, 6 Drawing Sheets

(56) References Cited

OTHER PUBLICATIONS

Almasi, H. et al., "Enhanced tunneling magnetoresistance and perpendicular magetic anisotrophy in Mo/CoFeB/MgO magnetic tunnel junctions," American Institute of Physics, Applied Physics Letters, vol. 106, No. 182406, 2015, 6 pages.
Yamanouchi M. et al., "Dependence of magnetic anisotropy on MgO thickness and buffer layer in Co20Fe60B20-MgO structure", Journal of Applied Physics, vol. 109, No. 07C712, 2011, 4 pages.
Xiang, Li et al., "Thermally stable voltage-controlled perpendicular magnetic anisotropy in MolCoFeBIMgO structures", Applied Physics Letters, vol. 107, No. 142403, 2015, 6 pages.
Jaivardhan, Sinha et al., "Enhanced interface perpendicular magnetic anisotropy in TalCoFeBIMgO using nitrogen doped Ta underlayers," Applied Physics Letters, vol. 102, No. 242405, 2013, 5 pages.
Liu, T. et al., "Large enhanced perpendicular magnetic anistropy in CoFeB/MgO system with typical Ta buffer replaced by an Hf layer," AIP Advances, vol. 2, No. 032151, 2012, 8 pages.
Watanabe, Kyota et al. "Magnetic Properties of CoFeB—MgO Stacks With Different Buffer-Layer Materials (Ta or Mo)," IEEE Transactions on Magnetics, vol. 52, No. 7, Jul. 2016, 4 pages.
Skowronski, Witold et al. "Underlayer material influence on electric-field controlled perpendicular magnetic anisotropy in CoFeB/MgO magnetic tunnel junctions," American Physical Society, Physics Review B, vol. 91, No. 184410, Published May 18, 2015, 6 pages.

\* cited by examiner

PERPENDICULAR MAGNETIC TUNNEL JUNCTION DEVICES WITH HIGH THERMAL STABILITY

CROSS-REFERENCE TO RELATED APPLICATIONS

The present application claims the benefit of U.S. Provisional Application Ser. No. 62/355,124, filed Jun. 27, 2016, which is hereby incorporated by reference in its entirety, including any figures, tables, and drawings.

This invention was made with government support under Grant Nos. 1310338 and 1430815, awarded by NSF and Grant No. HR0011-13-3-0002 awarded by DARPA. The U.S. Government has certain rights in this invention.

BACKGROUND

Magnetic tunnel junction (MTJ) structures with perpendicular magnetic anisotropy (PMA) are promising candidates for ultra-low energy memory and logic devices such as spin-transfer torque magnetic random access memories (STT-MRAM). Among different types of perpendicular magnetic tunnel junctions (pMTJs) (also referred to as perpendicularly magnetized magnetic tunnel junctions), heavy metal (HM)/CoFeB/MgO based structures have attracted a great deal of attention due to the advantage of having smaller STT-switching current and less material processing. In addition, PMA in HM/CoFeB/MgO can be controlled by voltage, which could lead to ultra-low energy switching (<0.1 fJ) in these structures. For practical applications, especially for MRAM smaller than 10 nm, a large tunneling magneto-resistance (TMR) in the range of several hundred percent and a strong PMA energy greater than 4 erg/cm2 are required for pMTJs. A high thermal budget over 400° C. for more than 1 hour is also required for compatibility with back end of line (BEOL) processes of CMOS technology.

Tantalum (Ta) is the most commonly used heavy metal in HM/CoFeB/MgO pMTJs due to its amorphous nature and high affinity with Boron. However, research shows that both TMR and PMA deteriorate upon annealing at temperatures above 400° C. for Ta/CoFeB/MgO junctions. Several other under layers such as Pt (Pd), Hf, Mo and W have been studied to improve thermal stability, TMR, PMA, electric field and spin orbit torque effects in pMTJs. While other materials may have superiority in one area, none offer improvement of both TMR and PMA after annealing. Furthermore, the doping of Ta buffer with N, or using a thin sacrificial Mg layer were also reported to improve PMA and TMR in pMTJs. However, improvements of pMTJs in terms of TMR, PMA and thermal stability are in demand.

SUMMARY

Perpendicular magnetic tunnel junction (pMTJ) devices with high thermal stability are described that include a thin dusting layer of molybdenum (Mo) within a heavy metal (HM)/CoFeB/MgO structure. The thin dusting layer of Mo is provided at the interface of the HM/CoFeB to provide a thermal barrier that can inhibit the intermixing of the HM with Fe, while allowing smaller B atoms to diffuse out during annealing. The devices are considered to have high thermal stability due to their being able to exhibit thermal stability when exposed to temperatures greater than 400° C. and even greater than 500° C. for an hour (and sometimes longer).

A pMTJ structure with high thermal stability can include a first HM layer, a first thin dusting layer on the first HM layer, a first CoFeB layer on the first thin dusting layer, a MgO barrier layer on the first CoFeB layer, a second CoFeB layer on the MgO layer, a second thin dusting layer on the second CoFeB layer, and a second HM layer on the thin dusting layer. The thin dusting layer is preferably Mo, but can be W, Zr, Nb, Ir and alloys of Mo, W, Zr, Nb, and Ir. The HM material can be Ta, Ru, Pt and alloys of Ta, Ru, and Pt.

A magnetic random access memory (MRAM) is also described that incorporates the thin dusting layer in the MTJ structure to provide high thermal stability during the fabrication process. The MRAM with high thermal stability can include a pMTJ that includes a thin dusting layer between a CoFeB layer and a heavy metal layer.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF DRAWINGS

FIG. 3A shows pure Ta, where $K_i$ is estimated to be 1.5 erg/cm2; FIG. 3B shows that $K_i$ increased to 1.63 erg/cm$^2$ as 0.6 nm Mo-dust was inserted; FIG. 3C shows that for Ta with 1.2 nm Mo-dust, $K_i$ increased to 1.74 erg/cm$^2$; and FIG. 3D shows that pure Mo exhibits the highest $K_i$ of 1.92 erg/cm$^2$.

DETAILED DESCRIPTION

Perpendicular magnetic tunnel junction (pMTJ) devices with high thermal stability are described that include a thin dusting layer within a heavy metal (HM)/ferromagnet/oxide structure.

As referred to herein, the "thin" thickness of a dusting layer refers to the relative thickness of the dusting layer as compared to the heavy metal layer. A dusting layer can be considered to be a "thin" layer when between a half atomic layer to 5 atomic layers. The actual thickness then depends on the material used. In some cases, a dusting layer is formed to a thickness of 0.1 nm-0.9 nm The thickness of "half an atomic layer" refers to a single atomic layer of low density, as commonly used in the art.

The devices are considered to have high thermal stability due to their being able to exhibit thermal stability when exposed to temperatures greater than 400° C. and even greater than 500° C. for an hour (and sometimes longer).

Figure 1A:
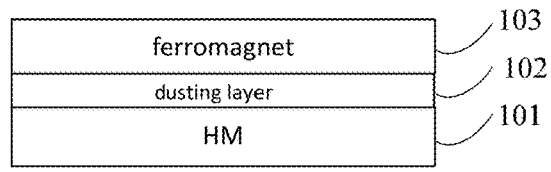
FIG. 1A shows an example cross-section of a simplified pMTJ device structure with a thin dusting layer within a HM/ferromagnet/oxide structure.

PMTJ devices can be used as ultra-low energy memory and logic devices for next-generation spintronic applications. PMTJs that use interfacial PMA in HM/ferromagnet/oxide structures can produce a high tunneling magnetoresistance (TMR). FIG. 1A shows an example cross-section of a simplified pMTJ device structure with a thin dusting layer within a HM/ferromagnet/oxide structure. The simplified pMTJ 100 has a HM layer 101 and a ferromagnetic layer 103 with a thin dusting layer 102 between the HM layer 101 and the ferromagnet layer 103.

Figure 1B:
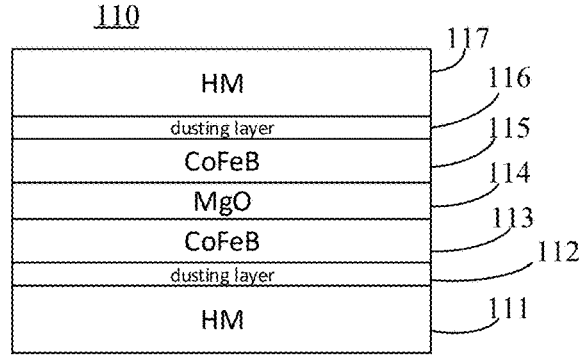
FIG. 1B shows an example cross-section of a pMTJ device core structure.

FIG. 1B shows an example cross-section of a pMTJ device core structure. In this example, the ferromagnet comprises CoFeB and the oxide comprises MgO. Referring to FIG. 1B, the structure 110 can include a first heavy metal layer 111; a first thin dusting layer 112 on the first heavy metal layer 111; a first CoFeB layer 113 on the first thin dusting layer 112; a MgO barrier layer 114 on the first CoFeB layer 113; a second CoFeB layer 115 on the MgO barrier layer 114; a second thin dusting layer 116 on the second CoFeB layer 115; and a second heavy metal layer 117 on the thin dusting layer 116. The first and second heavy metal layers 111 and 117 can be one or more of Ru, Ta, Pt, W, Mo, Nb, Hf, Ir, Zr, Cr, Re, Ti or alloys thereof. The first and second dusting layers 112 and 116 are usually the same material and can be, for example, Mo, W, Zr, Nb, or Ir, or an alloy of Mo, W, Zr, Nb, or Ir.

Table 1 shows a chart of different metals that could be used as a dusting layer. Metals with a higher (or more positive) average heat of formation should, in principle, be more difficult to form alloys with Fe, and therefore, better for dusting. On the other hand, highly refractive elements with a high resistance to heat are known to be Nb, Mo, Ta, W, and Re. As determined experimentally, starting from the elements with the highest heat of formation to the lowest, the preference for dusting layer metal are Mo, W, Re, Ta, Nb, V, Cr, Ru, Ti, Hf, and then Zr.

TABLE 1

| Fe-X With X= | Experiment Heat of Formation (Kj/Mol) | Theory Heat of Formation (Kj/Mol) |
| --- | --- | --- |
| Zr | — | −37 to −13 |
| Nb | −21 | −9 to −23 |
| Mo | −4.7 to 3.3 | −1 to −3 |
| Ru | — | −3 to −7 |
| Ta | −19 | −9 to −22 |
| W | −2.5 to +.4 | 0 |
| Hf | — | −11 to −30 |
| Re | — | 0 |
| Ti | −25 | −25 to −10 |
| Cr | — | −2 |
| V | +8 | −5 |

The thin dusting layer between the HM/ferromagnet interface can increase the TMR of a magnetic tunnel junction device. Indeed, TMR and PMA of MgO tunnel junctions can be dramatically improved by inserting a thin dusting layer of a material such as Mo at the HM/CoFeB interface. The dusting layer serves as a thermal barrier to inhibit the intermixing of HM with Fe, while allowing smaller B atoms to diffuse out during annealing.

Replacing Ta with Mo as the heavy metal substantially increases the thermal stability of pMTJs, leading to much higher PMA and TMR when the pMTJs have been annealed at 400° C. and above. This improvement appears to be related to the large formation energy of Mo—Fe alloys compared to that of Ta—Fe during annealing. However, Ta has the advantage of being a good Boron absorber. In addition, sputtered (thick) Mo layers show a strong crystalline structure, which could have adverse effects on the crystallization of CoFe (001) at the CoFe/MgO (001) interface during annealing.

A MTJ device can be fabricated with a thin Mo layer at the Ta/CoFeB interface in an effort to combine the advantages of both elements (Ta and Mo) by inhibiting serious intermixing of Ta and Fe while still allowing much smaller B atoms to be absorbed by Ta.

Figure 2A:
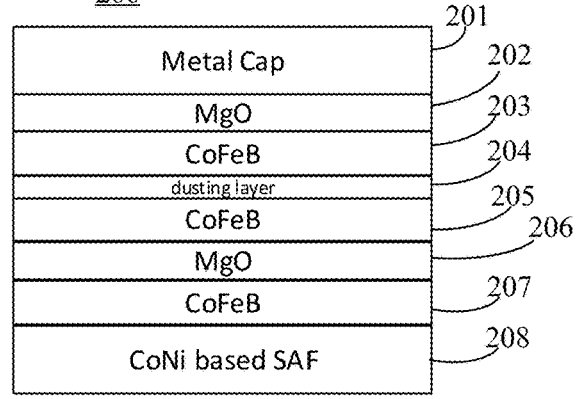
FIGS. 2A-2C illustrate example structures for a MRAM device.
Figure 2B:
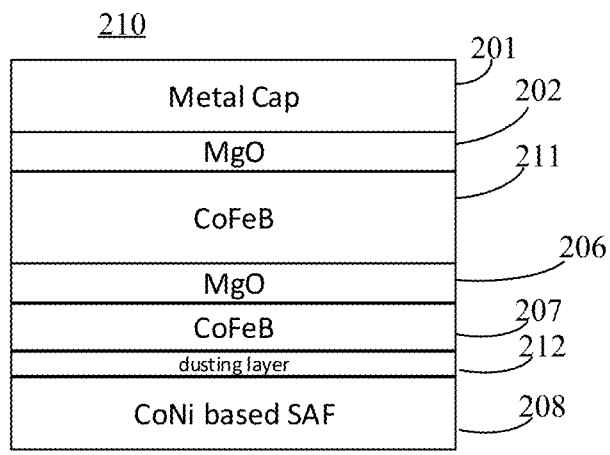
Figure 2C:
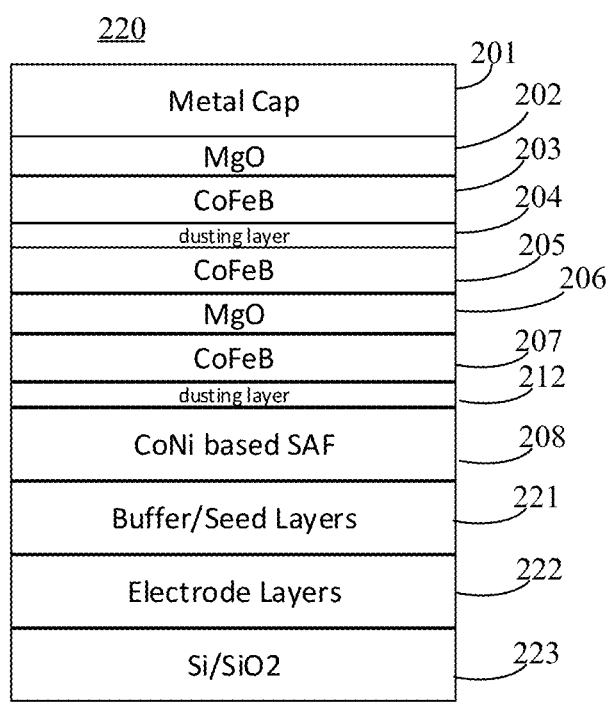
Figure 2D:
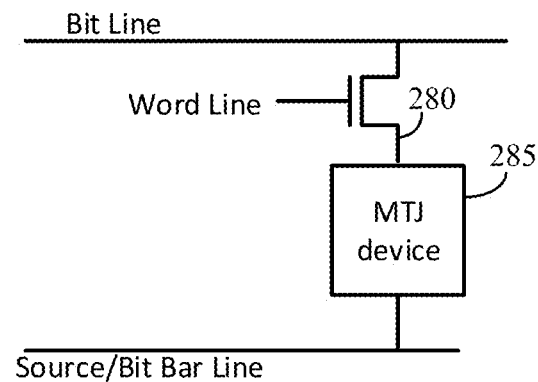
FIG. 2D illustrates a simplified schematic of a MRAM memory cell.

An example application of the described pMTJ is in an MRAM device. FIGS. 2A-2C illustrate example structures for a MRAM device; and FIG. 2D illustrates a simplified schematic of a MRAM memory cell. Regardless of the type of MRAM (write or read mechanisms), the core magnetic tunnel junction structure could benefit from a thin dusting layer such as described herein.

MRAM combines magnetic memory elements with CMOS. Each memory element uses a magnetic tunnel junction (MTJ) device for data storage. Unlike most other semiconductor memory technologies, the data is stored as a magnetic state, rather than charge, and sensed by measuring the resistance (via voltage or current sensing) without disturbing the magnetic state.

FIG. 2A illustrates one implementation of an MTJ MRAM structure 200 incorporating a thin dusting layer. Referring to FIG. 2A, a standard double MgO Barrier MTJ structure of metal cap, top MgO, CoFeB free layer, MgO tunnel barrier, CoFeB reference/fixed layer and CoNi based synthetic antiferromagnetic (SAF) can be implemented with a dusting layer in the CoFeB free layer, resulting in a structure of metal cap 201, top MgO 202, composite free layer of CoFeB 203, dusting layer 204, CoFeB 205, MgO tunnel barrier 206, CoFeB reference/fixed layer 207 and CoNi based SAF 208.

FIG. 2B illustrates another implementation of an MTJ MRAM structure 210 incorporating a thin dusting layer. Referring to FIG. 2A, the standard double MgO Barrier MTJ structure can incorporate a dusting layer as a spacer, or coupling layer, between the SAF and the CoFeB layer in the reference layer such that the dusting layer contacts the CoFeB opposite to the MgO side, resulting in a structure of metal cap 201, top MgO 202, CoFeB free layer 211, MgO tunnel barrier 206, CoFeB reference/fixed layer 207, dusting layer 212, and CoNi based SAF 208.

FIG. 2C illustrates a configuration 220 with dusting layers in the double MgO Barrier and as a spacer. Referring to FIG. 2C, in addition to the structure of metal cap 201, top MgO 202, composite free layer of CoFeB 203, dusting layer 204, CoFeB 205, MgO tunnel barrier 206, CoFeB reference/fixed layer 207, dusting layer 212, and CoNi based SAF 208, other layers may be included in the bottom of the structure, for example, buffer/seed layer(s) 221, electrode layer(s) 222, and substrate (e.g., Si/SiO2 223).

Although CoNi based SAF are illustrated in the drawings, other materials may be used. For example, CoPt and CoPd based SAF may be used.

When a bias is applied to the MTJ, electrons that are spin polarized by the magnetic layers traverse the dielectric barrier through a tunneling process. The MTJ device has a low resistance when the magnetic moment of the free layer is parallel to the fixed layer and a high resistance when the free layer moment is oriented antiparallel to the fixed layer moment. A 1 transistor 1 MTJ memory cell containing the MTJ device can be configured as shown in FIG. 2D. Referring to FIG. 2D, a memory cell can include a transistor 280 connecting the MTJ 285 to a bit line when turned on by a signal applied to a word line.

EXPERIMENTAL EXAMPLES

As shown by the experimental results, a large TMR of 208% was experimentally achieved. Additionally, adding the thin Mo dusting layer has been shown to allow the pMTJ to withstand an annealing temperature of 500° C. without TMR and PMA degradation.

One example pMTJ comprises multilayers of, for example, Mo/Ru/Mo/CoFeB/MgO/CoFeB/Mo/Ru. Ru is used in this example, but other heavy metals such as Ta, Pt and alloys of Ru, Ta, and Pt can also be used. Experimental results of the Mo/Ru/Mo/CoFeB/MgO/CoFeB/Mo/Ru pMTJ showed a high (in the range of 160-165%) measured TMR after annealing when studied.

The multilayer structures of the experimental pMTJ device structures were fabricated on silicon wafers with 300 nm of thermal oxide by a customized 12-source magnetron sputtering system (AJA-International) with the base pressure in the range of $10^{-9}$ Torr. All metallic layers were deposited at ambient temperature using DC magnetron sputtering at 2 mTorr working pressure. A MgO layer was grown by RF magnetron sputtering at 1 mTorr. The composition of CoFeB alloy used in this study was $Co_{20}Fe_{60}B_{20}$, however, it should be understood that other compositions could also be used. According to certain embodiments, a method of fabricating a pMTJ can include forming a first heavy metal layer; forming a first dusting layer on the first heavy metal layer; forming a first CoFeB layer on the first dusting layer; forming a MgO barrier layer on the first CoFeB layer; forming a second CoFeB layer on the MgO barrier layer; forming a second dusting layer on the second CoFeB layer; forming a second heavy metal layer on the second dusting layer; and annealing the pMTJ. The fabrication steps can be any suitable fabrication process. It is expected that physical vapor deposition, or sputtering, may be used. In addition, that the dusting layer could be deposited in the same chamber as the CoFeB.

XRD characterizations were done by PANalytical X'Pert Pro Multi-Purpose Diffractometer in θ-2θ configuration at the Cu Kα wavelength of λ=0.154 nm. The magnetic properties of continuous films were analyzed by Microsense EZ-9 Vibrating Sample Magnetometer (VSM). For studying TMR, continuous films were patterned and etched by conventional photolithography and Argon ion milling to obtain circular junctions with 3-25 μm diameter. All of the measurements were conducted at room temperature.

Figure 3:
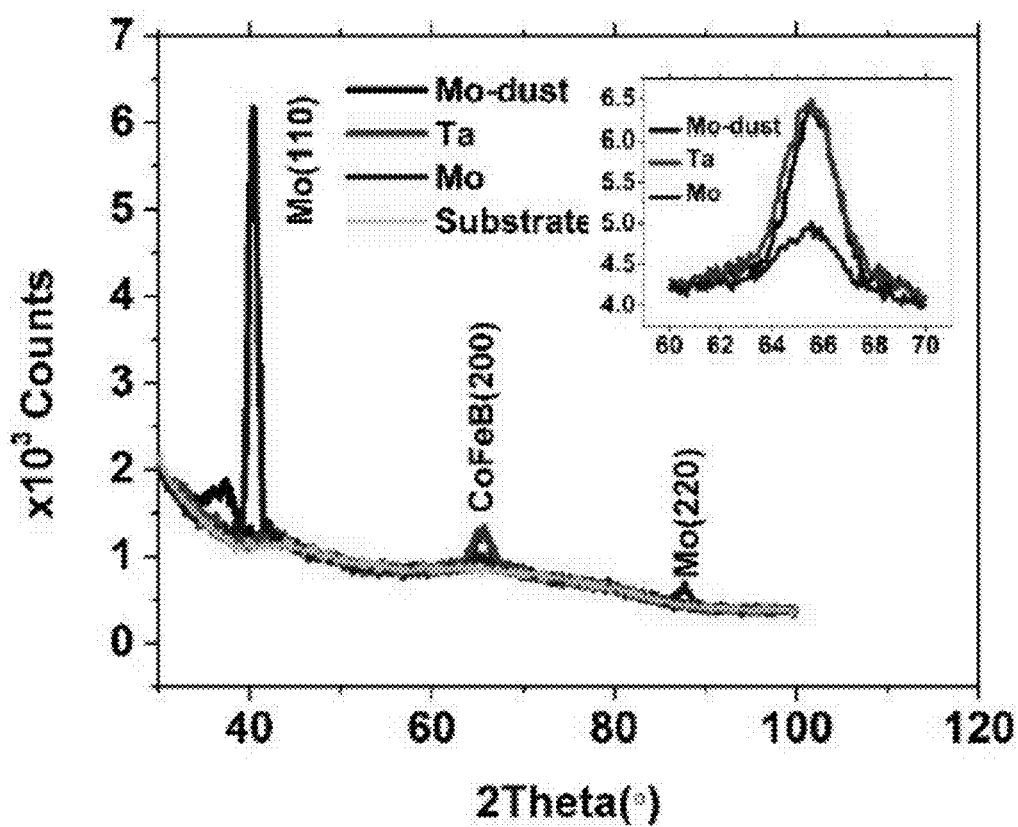
FIG. 3 shows the results of X-ray diffraction (XRD) measurements of pMTJ structures, illustrating the effect of inserting a thin Mo layer at a Ta/CoFeB interface.

An XRD study was performed to experimentally verify the advantages of inserting a thin Mo layer at the Ta/CoFeB interface. Multilayers consisting of Ta(8)/CoFeB(5)/MgO (2)/CoFeB(5)/Ta(8), Mo(8)/CoFeB(5)/MgO(2)/CoFeB(5)/ Mo(8) and Ta(8)/Mo(0.9)/CoFeB(5)/MgO(2)/CoFeB(5)/Mo (0.9)/T(8) were fabricated on glass substrates, where numbers in parentheses indicate the thickness in nanometers. These films were annealed at 400° C. for 1 hour. FIG. 3 shows the results of the XRD measurements. For all three samples, a peak at 65.8° corresponding to CoFe (200) was observed. For a better comparison, 2θ scans for 60°-70° are shown in the inset of FIG. 2.

As shown in FIG. 3, the XRD patterns produce a few very distinct features. Firstly, for the sample with pure Mo capping and buffer layers, a strong peak exists at Mo (110) position (40°) together with a small peak corresponding to Mo (220) (87°), which indicate that sputtered Mo layers are highly textured. In contrast, for the pure Ta sample, no diffraction peaks are observed, suggesting that Ta layers are largely amorphous, which is consistent with previous research. Secondly, both Ta and Mo-dust samples showed a larger volume of CoFe (200) than the Mo sample. This is likely due to the adverse effect of highly textured Mo that interferes with the solid state epitaxial (SSE) growth of CoFe (001) during annealing.

Ideally, the SSE of CoFe (001) should start at the MgO interface where the MgO barrier produced by sputtering already assumes a (001)-orientation in the as-prepared state. It is expected that any crystalline structure of the buffer/ capping layer will have a negative influence on the SSE of CoFe (001) during annealing, especially when the thickness of the bottom CoFeB is only 0.8-0.9 nm in pMTJs. On the other hand, the higher energy of formations of Mo borides (−47.5 kJ/mole) compared to that of Ta (−66 KJ/mole) could also contribute to the weak CoFe (200)-peak of the Mo sample. Thirdly, and most importantly, the full width at half maximum (FWHM) for the Mo-dust sample is about 15% smaller than Ta sample, suggesting better crystalline structure of CoFe in (200) direction for the Mo-dust sample. This indicates that the very thin Mo dusting layer does, in fact, act as a thermal barrier to inhibit Ta intermixing with Fe, and allows small B atoms to diffuse out and be absorbed by Ta during annealing process. This very thin Mo dusting layer is likely to be amorphous when grown on amorphous Ta or amorphous CoFeB. These experiments were carried out with thick CoFeB layers (5 nm) due to the detection limit of the X-ray diffractometer. It is expected that this effect could be much more pronounced in real pMTJ structures where the CoFeB layers are only 0.8-1.6 nm thick. Microstructure study by transmission electron microscopy is underway to further elucidate the precise role of the Mo-dusting layers.

Figure 4A:
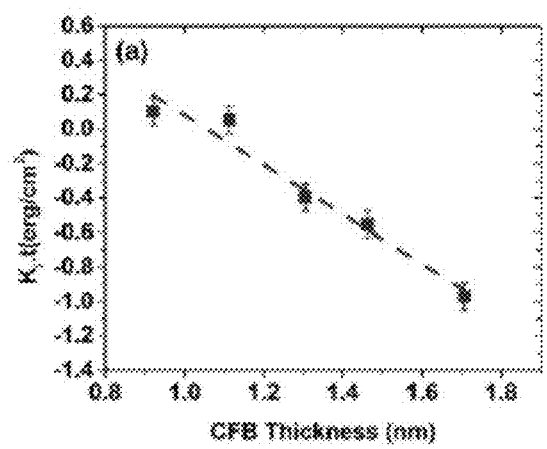
FIGS. 4A-4D show $K_i \cdot t_{CoFeB}$ vs thickness of CoFeB ($t_{CoFeB}$) for various buffer structures.
Figure 4B:
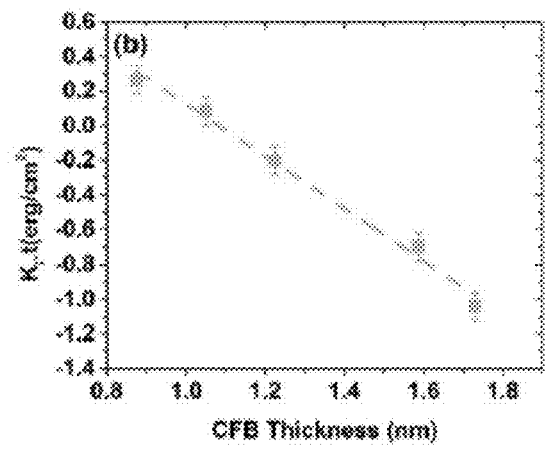
Figure 4C:
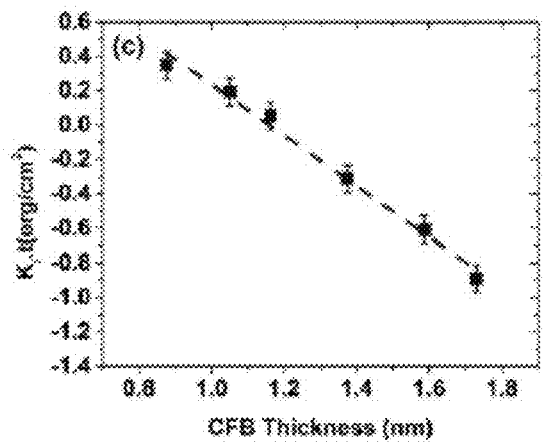
Figure 4D:
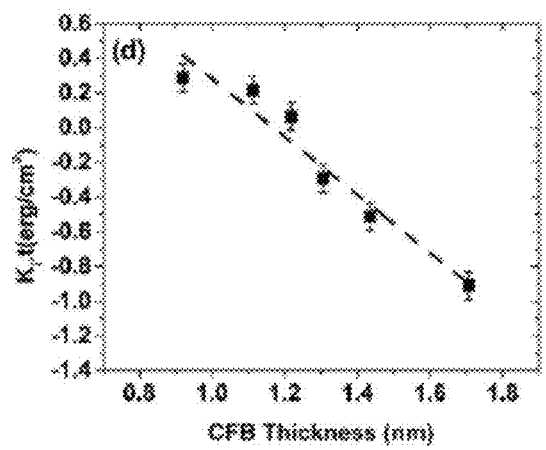

A series of vibrating sample magnetometer (VSM) measurements were performed to investigate the impact of the Mo dusting layers on magnetic properties of pMTJs by extracting interfacial magnetic anisotropy ($K_i$) in the form of $K_i \cdot t_{CoFeB}$ where $t_{CoFeB}$ is the thickness of CoFeB layers. Multilayers with the following structure were fabricated: Si/SiO$_2$/Ta(6)/Ru(10)/Ta(8)/CoFeB(t)/MgO(2)/Ta(5), Si/SiO$_2$/Ta(6)/Ru(10)/Ta(8)/Mo(0.6 or 1.2)/CoFeB(t)/MgO (2)/Ta(5) and Si/SiO$_2$Mo(6)/Ru(10)/Mo(8)/CoFeB(t)/MgO (2)/Ta(5), where CoFeB thickness (t) is ranging from 0.8 to 1.8 nm. FIGS. 4A-4D show $K_i \cdot t_{CoFeB}$ vs thickness of CoFeB ($t_{CoFeB}$) for various buffer structures. FIG. 4A shows pure Ta, where $K_i$ is estimated to be 1.5 erg/cm2. FIG. 4B shows that K increased to 1.63 erg/cm$^2$ as 0.6 nm Mo-dust was inserted. FIG. 4C shows that for Ta with 1.2 nm Mo-dust, $K_i$ increased to 1.74 erg/cm$^2$. FIG. 4D shows that pure Mo exhibits the highest $K_i$ of 1.92 erg/cm$^2$. The results from these VSM measurements suggest that the insertion of a Mo dusting layer helps the Ta layer to improve thermal stability by reducing intermixing of Ta with CoFeB layers, and consequently enhances the $K_i$ value. Additionally, the range of CoFeB thicknesses showing PMA for a pure Mo sample and a 1.2 nm Mo-dust sample is wider (up to 1.2 nm compared to 1 nm) than those for 0.6 nm Mo-dust and pure Ta buffers.

Figure 5:
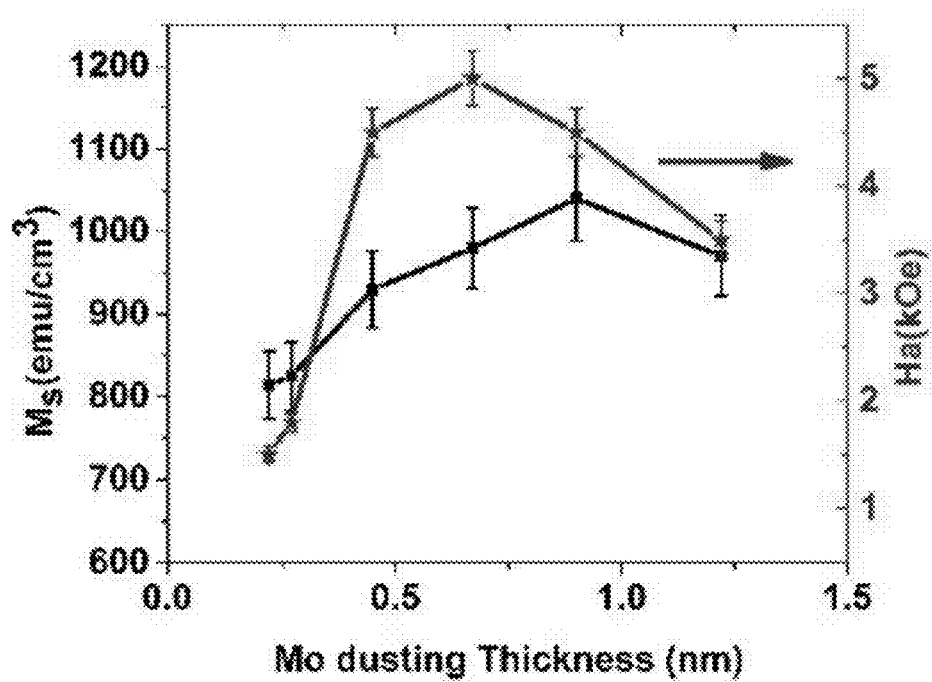
FIG. 5 shows the saturation magnetization ($M_S$) and magnetic anisotropy field ($H_a$) versus different Mo dusting layer thicknesses.

In another example, the magnetic properties of various MTJ films with different Mo-dust layer thickness were studied. Films with the structures of Si/SiO$_2$/Ta(6)/Ru(10)/ Ta(8)/Mo(t)/CoFeB(0.85)/MgO(2)/CoFeB(1.5)/Mo(t)/Ta (8)/Ru(20) where the Mo dusting layer thickness (t) has different values of 0, 0.45, 0.55, 0.67, 0.9, 1.2 nm and Si/SiO$_2$/Mo(6)/Ru(10)/Mo(8)/CoFeB(0.85)/MgO(2)/ CoFeB(1.5)/Mo(8)/Ru(20) were fabricated and subsequently annealed at 420° C. for 10 minutes. FIG. 5 shows the saturation magnetization (M$_S$) and magnetic anisotropy field (H$_a$) versus different Mo dusting layer thicknesses. As shown in FIG. 4, a monotonic increase occurred for M$_S$ and H$_a$ when the thickness of the Mo-dust layer increased up to 0.7 nm. After 0.7 nm, H$_a$ began to decline, which could be due to the templating effect of highly crystalline Mo on CoFeB layers. On the other hand, M$_S$ rose to above 1000 emu/cc for a 0.9 nm Mo-dust and then dropped slightly to 970 emu/cc for a 1.1 nm Mo-dust sample. M$_S$ of the sample with thick Mo (6 nm) layers (not shown here) is also 1000 emu/cc. Therefore, it is observed that M$_S$ begins to saturate for Mo-dust thicknesses above 0.9 nm. Since the PMA energy of pMTJ is estimated by E$_P$=½H$_a$·M$_S$, the best thickness of the Mo-dusting layer was determined to be 0.7-0.9 nm, as shown in FIG. 4.

Figure 6A:
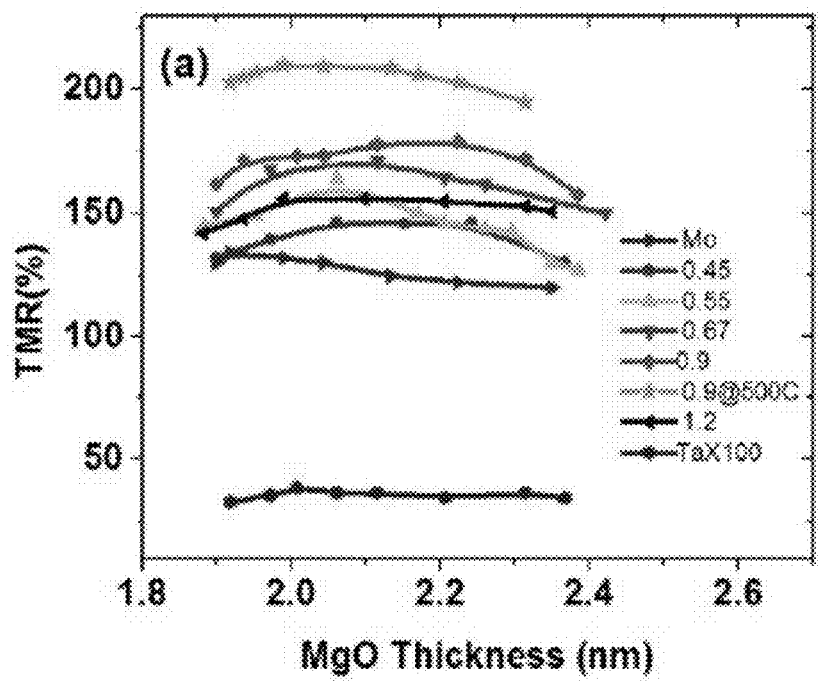
FIG. 6A shows tunneling magneto-resistance (TMR) versus MgO thickness for different buffer/capping layers.
Figure 6B:
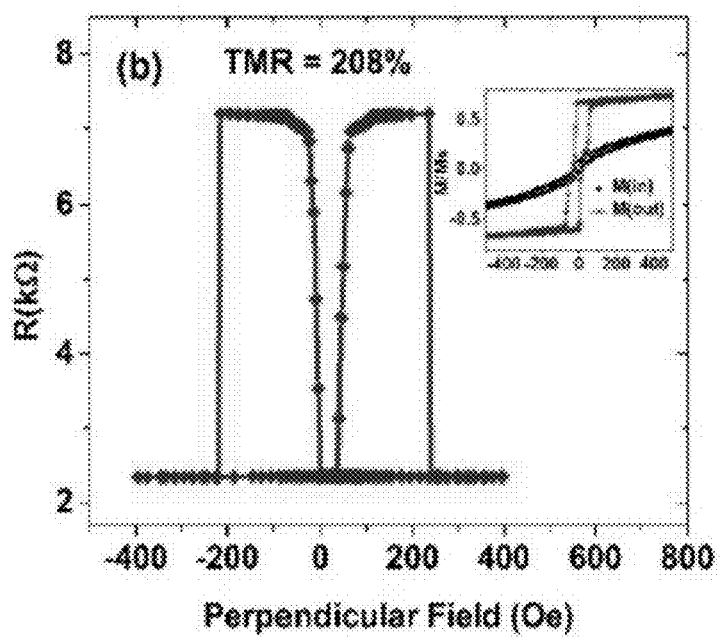
FIG. 6B shows the TMR curve of a sample with 208% TMR.

Next, the dependence of TMR on different under layers was studied using the structural and magnetic results obtained as described above. The samples chosen have an identical structure as the full MTJs studied by VSM and were annealed at 420° C. for 10 minutes. FIG. 6A shows TMR versus MgO thickness for different buffer/capping layers. Note that the TMR for a Ta sample is magnified 100 times to be comparable to other values. The reason for such a small TMR for Ta samples is due to the lack of a well-defined antiparallel state at this annealing condition (420° C. for 10 minutes). In contrast to the Ta behavior, samples containing any amount of Mo showed reasonably high TMR and sharp magnetization switching for the entire range of MgO thicknesses studied. As a 0.45 nm Mo dusting layer was introduced to the pure Ta buffer and capping layers, an immediate increase of TMR to values larger than the pure Mo sample was observed. Furthermore, a nearly monotonic increase in TMR values occurred for thicker Mo dusting layers with thicknesses of 0.55 nm, 0.67 nm and 0.9 nm. A decrease of TMR occurred when the thickness of the Mo layer reached 1.2 nm. These experimental results show that the average TMR values increase as a function of the Mo dusting layer up to 0.9 nm thick Mo and then decreases. Annealing at higher temperatures improves the CoFeB/MgO interface that gives rise to high TMR values for the samples with a 0.9 nm Mo dusting layer. In this example, the annealing temperature was elevated to of 500° C. for 10 min, which resulted in high TMR values above 200% for almost the entire range were achieved. FIG. 6B shows the TMR curve of a sample with 208% TMR. Next, VSM measurements were performed on the sample for both perpendicular magnetic field and in-plane magnetic field as illustrated in the inset of FIG. 5B. Easy-axis switching behavior for both soft and hard magnetic layer is observed under application of perpendicular magnetic field. The average PMA energy of this particular sample with both soft and hard CoFeB is estimated to be around 1.5 Merg/cc without taking into account the dead layer thickness.

These results further highlight the role of the HM/CoFeB interface in the magnetic and transport properties of HM/CoFeB/MgO junctions. As previously discussed, the formation of Fe—Mo binaries is less likely due to the high energy involved compared to that of Fe—Ta. Although the highly crystalline nature of thick Mo layers could interfere with the SSE process, it also means less tendency to diffuse toward the adjacent CoFeB layer during annealing. On the other hand, amorphous Ta is more easily interdiffused with CoFeB during the annealing process and, consequently, degrades the magneto-transport properties. In addition, diffusion toward the CoFeB/MgO interface and the formation of different oxides is more likely to happen for Ta samples because of their greater negative energy of formation compared to that of Mo and Mg. Finally, since the average enthalpy of formation of borides for Mo (−47.5 KJ/mole) is higher than that of Ta (−66 KJ/mole), it is expected that Ta is a better B absorbent leading to better crystallization of adjacent CoFeB layers. Therefore, by using an ultrathin Mo layer between Ta and CoFeB layers, Mo can inhibit the interdiffusion of Ta and CoFeB, and at the same time allow small boron atoms to be absorbed more efficiently by Ta layers.

In summary, the effect of a thin Mo dusting layer inserted at the interface of Ta/CoFeB was investigated. Unlike thick Mo layers exhibiting strong (110) crystalline texture, the Mo dusting layer exhibited little negative influence on the crystallization of CoFe (001). For optimized Mo dusting thickness, large TMR above 200% as well as strong thermal stability were simultaneously achieved.

It should be understood that the examples and implementations described herein are for illustrative purposes only and that various modifications or changes in light thereof will be suggested to persons skilled in the art and are to be included within the spirit and purview of this application.

What is claimed is:

1. A perpendicular magnetic tunnel junction device (pMTJ) comprising:
    a first heavy metal layer;
    a first thin dusting layer on the first heavy metal layer;
    a first CoFeB layer on the first thin dusting layer;
    a MgO barrier layer on the first CoFeB layer;
    a second CoFeB layer on the MgO barrier layer;
    a second thin dusting layer on the second CoFeB layer; and
    a second heavy metal layer on the thin dusting layer.

2. The pMTJ of claim 1, wherein the first heavy metal and the second heavy metal layer are each selected from the group consisting of Ru, Ta, Pt, W, Mo, Nb, Hf, Ir, Zr, Cr, Re, Ti and alloys of Ru, Ta, Pt, W, Mo, Nb, Hf, Ir, Zr, Cr, Re, and Ti.

3. The pMTJ of claim 1, wherein the first thin dusting layer and the second thin dusting layer are each selected from the group consisting of Mo, W, Zr, Nb, Ir and alloys of Mo, W, Zr, Nb and Ir.

4. The pMTJ of claim 1, wherein the thickness of the first thin dusting layer is between 0.1-0.9 nm; and the thickness of the second thin dusting layer is between 0.1-0.9 nm.

5. The pMTJ of claim 1, wherein the first thin dusting layer and the second thin dusting layer each comprise Mo.

6. A highly thermal stable magnetic random access memory (MRAM) unit comprising:
    at least one perpendicular magnetic tunnel junction device (pMTJ), the pMTJ comprising:
        a first heavy metal layer;
        a first thin dusting layer on the first heavy metal layer;
        a first CoFeB layer on the first thin dusting layer;
        a MgO barrier layer on the first CoFeB layer;
        a second CoFeB layer on the MgO barrier layer;
        a second thin dusting layer on the second CoFeB layer; and
        a second heavy metal layer on the thin dusting layer.

7. The MRAM unit of claim 6, wherein the first heavy metal and the second heavy metal layer are each selected from the group consisting of Ta, Ru, Pt and alloys of Ta, Ru and Pt.

8. The MRAM unit of claim 6, wherein the first thin dusting layer and the second thin dusting layer are each selected from the group consisting of Mo, W, Zr, Nb, Ir and alloys of Mo, W, Zr, Nb and Ir.

9. The MRAM unit of claim 6, wherein the thickness of the first thin dusting layer is between 0.1-0.9 nm; and the thickness of the second thin dusting layer is between 0.1-0.9 nm.

10. The MRAM unit of claim 6, wherein the first thin dusting layer and the second thin dusting layer each comprises Mo.

11. A method of fabricating a pMTJ, the method comprising:
   forming a first heavy metal layer;
   forming a first dusting layer on the first heavy metal layer;
   forming a first CoFeB layer on the first dusting layer;
   forming a MgO barrier layer on the first CoFeB layer;
   forming a second CoFeB layer on the MgO barrier layer;
   forming a second dusting layer on the second CoFeB layer;
   forming a second heavy metal layer on the second dusting layer; and
   annealing the pMTJ.

12. The method of claim 11, wherein the first heavy metal and the second heavy metal layer are each selected from the group consisting of Ru, Ta, Pt, W, Mo, Nb, Hf, Ir, Zr, Cr, Re, Ti and alloys of Ru, Ta, Pt, W, Mo, Nb, Hf, Ir, Zr, Cr, Re, and Ti.

13. The method of claim 11, wherein the first dusting layer and the second dusting layer are each selected from the group consisting of Mo, W, Zr, Nb, Ir and alloys of Mo, W, Zr, Nb and Ir.

14. The method of claim 11, wherein the first dusting layer is formed to a thickness of between 0.1-0.9 nm; and the second dusting layer is formed to a thickness of between 0.1-0.9 nm.

15. The method of claim 11, wherein the first dusting layer and the second dusting layer each comprise Mo.

* * * * *